United States Patent
Ichikawa et al.

(10) Patent No.: US 11,594,674 B2
(45) Date of Patent: Feb. 28, 2023

(54) TUNNEL BARRIER LAYER, MAGNETORESISTANCE EFFECT ELEMENT, METHOD FOR MANUFACTURING TUNNEL BARRIER LAYER, AND INSULATING LAYER

(71) Applicant: TDK CORPORATION, Tokyo (JP)

(72) Inventors: Shinto Ichikawa, Tokyo (JP); Katsuyuki Nakada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 81 days.

(21) Appl. No.: 16/822,854

(22) Filed: Mar. 18, 2020

(65) Prior Publication Data
US 2020/0303630 A1    Sep. 24, 2020

(30) Foreign Application Priority Data

Mar. 22, 2019  (JP) .............. JP2019-055048
Mar. 10, 2020  (JP) .............. JP2020-041278

(51) Int. Cl.
*H01L 43/08* (2006.01)
*H01L 43/04* (2006.01)
*H01L 43/10* (2006.01)
*H01L 43/14* (2006.01)

(52) U.S. Cl.
CPC .............. *H01L 43/04* (2013.01); *H01L 43/10* (2013.01); *H01L 43/14* (2013.01)

(58) Field of Classification Search
CPC ..................................................... H01L 43/08
See application file for complete search history.

(56) References Cited

U.S. PATENT DOCUMENTS

| | | | | |
|---|---|---|---|---|
| 2009/0243007 A1* | 10/2009 | Buttet | .......... | B82Y 25/00 257/E29.323 |
| 2012/0091548 A1 | 4/2012 | Sukegawa et al. | | |
| 2013/0221461 A1* | 8/2013 | Sukegawa | .......... | H01L 43/10 257/E29.323 |

FOREIGN PATENT DOCUMENTS

| | | | |
|---|---|---|---|
| JP | 5586028 B2 | 9/2014 | |
| JP | 5988019 B2 | 9/2016 | |

OTHER PUBLICATIONS

Sukegawa, Hiroaki et al., "Tunnel Magnetoresistance With Improved Bias Voltage Dependence in Lattice-Matched Fe/Spinel MgAl2O4/Fe (001) Junctions", Applied Physics Letter, vol. 96, pp. 212505-212505-3, (2010).
Miura, Yoshio et al., "First-Principles Study of Tunneling Magnetoresistance in Fe/MgAl2O4/Fe (001) Magnetic Tunnel Junctions", Physical Review B, vol. 86, pp. 024426-1-024426-6, (2012).
Scheike, Thomas et al., "Lattice-Matched Magnetic Tunnel Junctions Using a Heusler Alloy Co2FeAl and a Cation Disorder Spinel Mg—Al—O BARRIER", Applied Physics Letter, vol. 105, pp. 242407-1-242407-5, (2014).

\* cited by examiner

*Primary Examiner* — Moazzam Hossain
*Assistant Examiner* — Hajar Kolahdouzan
(74) *Attorney, Agent, or Firm* — Oliff PLC

(57) ABSTRACT

A tunnel barrier layer includes a non-magnetic oxide, wherein a crystal structure of the tunnel barrier layer includes both an ordered spinel structure and a disordered spinel structure.

12 Claims, 7 Drawing Sheets

TUNNEL BARRIER LAYER, MAGNETORESISTANCE EFFECT ELEMENT, METHOD FOR MANUFACTURING TUNNEL BARRIER LAYER, AND INSULATING LAYER

TECHNICAL FIELD

The present invention relates to a tunnel barrier layer, a magnetoresistance effect element, a method for manufacturing the tunnel barrier layer, and an insulating layer.

Priority is claimed on Japanese Patent Application No. 2019-055048, filed Mar. 22, 2019, and Japanese Patent Application No. 2020-041278, filed Mar. 10, 2020, the content of which is incorporated herein by reference.

BACKGROUND ART

A giant magnetoresistance (GMR) element made up of a multilayer film of a ferromagnetic layer and a non-magnetic layer, and a tunnel magnetoresistance (TMR) element with an insulating layer (a tunnel barrier layer, and a barrier layer) used for the non-magnetic layer are known. In general, a TMR element has a higher element resistance but a larger magnetoresistance (MR) ratio than a GMR element. Attention has been focused on TMR elements, as an element for a magnetic sensor, a high-frequency component, a magnetic head, and a nonvolatile magnetoresistive random access memory (MRAM).

TMR elements can be classified into two types depending on a difference in the mechanism of tunnel conduction of electrons. One type is a TMR element using only a bleeding effect (a tunnel effect) of a wave function between ferromagnetic layers. The other type is a TMR element in which a coherent tunnel (in which only electrons having the symmetry of a specific wave function tunnel) in which the symmetry of the wave function is maintained is dominant. The TMR element in which coherent tunneling is dominant can obtain a larger MR ratio than a TMR element using only a tunnel effect.

MgO is an example of a tunnel barrier layer in which a coherent tunnel phenomenon occurs. As a material in lieu of MgO, for example, ternary oxides (Mg—Al—O) made up of Mg, Al, and O are also being studied. Mg—Al—O has improved lattice matching with a ferromagnetic material as compared with MgO, and even when a high voltage is applied, it is unlikely that an MR ratio will be lower than in conventional MgO.

For example, Japanese Patent No. 5586028 discloses an example in which $MgAl_2O_4$ having a spinel-type crystal structure is used for a tunnel barrier layer.

Further, Japanese Patent No. 5988019 discloses a ternary oxide (Mg—Al—O) having a cubic crystal (a disordered spinel structure) having half a lattice constant of the spinel structure. Since the disordered spinel structure is a metastable structure, the tunnel barrier layer can be formed without being limited to the stoichiometric composition of the spinel structure. In the disordered spinel structure, the lattice constant can be continuously changed by adjusting the Mg—Al composition ratio. Further, Japanese Patent No. 5988019 discloses a magnetoresistance effect element in which a tunnel barrier layer having a disordered spinel structure and a BCC-type Co—Fe-based ferromagnetic layer are combined. When the tunnel barrier layer having the disordered spinel structure and the BCC-type Co—Fe-based ferromagnetic layer are combined, a band folding effect is suppressed, and the magnetoresistance effect element stably exhibits a large MR ratio.

The tunnel barrier layer having the ordered spinel structure described in Japanese Patent No. 5586028 cannot obtain a sufficiently large MR ratio. Further, in the tunnel barrier layer having the disordered spinel structure described in Japanese Patent No. 5988019, the MR ratio easily decreases when a high voltage is applied. A large MR ratio and a high voltage resistance are required to improve an output voltage of a magnetoresistance effect element.

In view of such circumstances, an object of the present invention is to provide a magnetoresistance effect element capable of improving an output voltage.

SUMMARY OF THE INVENTION

The present inventors have introduced both an ordered spinel structure and a disordered spinel structure in the tunnel barrier layer. The present invention provides the following means to solve the aforementioned problems.

(1) A tunnel barrier layer according to a first aspect includes a non-magnetic oxide, wherein a crystal structure of the tunnel barrier layer includes both an ordered spinel structure and a disordered spinel structure.

(2) In the tunnel barrier layer according to the aforementioned aspect, a lattice constant of the a disordered spinel structure may be substantially half of a lattice constant of the ordered spinel structure.

(3) The tunnel barrier layer according to the aforementioned aspect may have two or more of a first portion indicating a first electron beam pattern, a second portion indicating a second electron beam pattern, and a third portion indicating a first pseudo electron beam pattern, in nano-electron beam diffraction using a transmission electron microscope.

(4) In the tunnel barrier layer according to the aforementioned aspect consists of a third portion indicating the first pseudo electron beam pattern in nano-electron beam diffraction using a transmission electron microscope.

(5) In the tunnel barrier layer according to the aforementioned aspect, a ratio of the ordered spinel structure may be 10% or more and 90% or less.

(6) In the tunnel barrier layer according to the aforementioned aspect, a ratio of the ordered spinel structure may be 20% or more and 80% or less.

(7) In the tunnel barrier layer according to the aforementioned aspect, the non-magnetic oxide may include Mg and at least one of Al and Ga.

(8) The tunnel barrier layer according to the aforementioned aspect may have an oxide containing Mg and Ga, and an oxide containing Mg and Al, in which the oxide containing Mg and Ga may have the ordered spinel structure, and the oxide containing Mg and Al may have the a disordered spinel structure.

(9) In the tunnel barrier layer according to the aforementioned aspect, an orientation direction of the crystal may be a (001) orientation.

(10) A magnetoresistance effect element according to a second aspect includes the tunnel barrier layer according to the aforementioned aspect, and a first ferromagnetic layer and a second ferromagnetic layer sandwiching the tunnel barrier layer in a thickness direction.

(11) In the magnetoresistance effect element according to the second aspect, at least one of the first ferromagnetic layer and the second ferromagnetic layer may contain elemental Fe.

(12) A method for manufacturing a tunnel barrier layer according to a third aspect includes first conditions in which oxygen sufficient to form an ordered spinel structure is supplied; and second conditions in which an amount of oxygen supply is smaller than in the first conditions.

(13) An insulating layer according to a fourth aspect includes a non-magnetic oxide, wherein a crystal structure of the insulating layer includes both an ordered spinel structure and a disordered spinel structure.

The magnetoresistance effect element according to an aspect of the present invention has an improved output voltage.

DETAILED DESCRIPTION OF THE INVENTION

Figure 1:
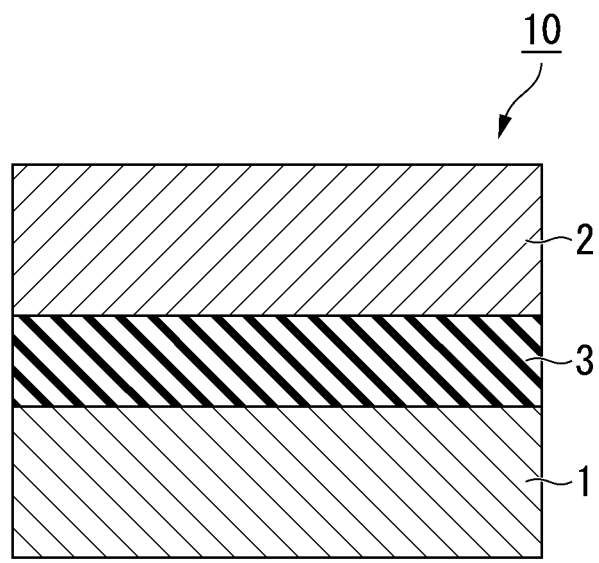
FIG. 1 is a cross-sectional view of a magnetoresistance effect element according to an embodiment.

Hereinafter, the present invention will be described in detail with reference to the drawings as appropriate. In the drawings used in the following description, there may be cases in which characteristic parts are enlarged for convenience to make the features of the present invention easy to understand, and dimensional ratios and the like of the respective components may be different from actual ones. Materials, dimensions, and the like shown in the following description are merely examples, and the present invention is not limited thereto, and can be implemented with appropriate changes without departing from the scope of the invention.

'Magnetoresistance Effect Element'

FIG. 1 is a cross-sectional view of a magnetoresistance effect element according to the present embodiment. FIG. 1 is a cross-sectional view of a magnetoresistance effect element 10 taken along a laminating direction of each layer of the magnetoresistance effect element. The magnetoresistance effect element 10 has a first ferromagnetic layer 1, a second ferromagnetic layer 2, and a tunnel barrier layer 3. The magnetoresistance effect element 10 may have a cap layer, a base layer, and the like in addition to these layers. The tunnel barrier layer 3 is an example of an insulating layer.

(First Ferromagnetic Layer, and Second Ferromagnetic Layer)

The first ferromagnetic layer 1 and the second ferromagnetic layer 2 are magnetic materials. The first ferromagnetic layer 1 and the second ferromagnetic layer 2 each have a magnetization. The magnetoresistance effect element 10 outputs a change in the relative angle between the magnetization of the first ferromagnetic layer 1 and the magnetization of the second ferromagnetic layer 2 as a resistance change.

The magnetization of the second ferromagnetic layer 2 is, for example, harder to move than the magnetization of the first ferromagnetic layer 1. When a predetermined external force is applied, the direction of magnetization of the second ferromagnetic layer 2 does not change (is fixed), and the direction of magnetization of the first ferromagnetic layer 1 changes. When the direction of magnetization of the first ferromagnetic layer 1 changes with respect to the direction of magnetization of the second ferromagnetic layer 2, a resistance value of the magnetoresistance effect element 10 changes. In this case, the second ferromagnetic layer 2 may be called a magnetization fixed layer, and the first ferromagnetic layer 1 may be called a magnetization free layer. Hereinafter, a case in which the first ferromagnetic layer 1 is a magnetization free layer and the second ferromagnetic layer 2 is a magnetization fixed layer will be described as an example.

The first ferromagnetic layer 1 and the second ferromagnetic layer 2 include a ferromagnetic material. The ferromagnetic material forming the first ferromagnetic layer 1 and the second ferromagnetic layer 2 is, for example, a metal selected from a group consisting of Cr, Mn, Co, Fe and Ni, an alloy containing at least one of these metals, and an alloy containing these metals and elements of at least one kind or more from B, C, and N. The first ferromagnetic layer 1 and the second ferromagnetic layer 2 contain, for example, an Fe element. The first ferromagnetic layer 1 and the second ferromagnetic layer 2 containing the Fe element have high spin polarizability, and thus a MR ratio of the magnetoresistance effect element 10 increases. The first ferromagnetic layer 1 and the second ferromagnetic layer 2 are made of, for example, Fe, Co—Fe, Co—Fe—B, and Ni—Fe.

The first ferromagnetic layer 1 and the second ferromagnetic layer 2 may be a Heusler alloy. The Heusler alloy is a half-metal and has high spin polarizability. The Heusler alloy is an intermetallic compound having a chemical composition of XYZ or $X_2YZ$, X is a transition metal element or a noble metal element from the Co, Fe, Ni, and Cu groups in the periodic table, Y is a transition metal from the Mn, V, Cr, and Ti groups or an element type of X, and Z is a typical element from group III to group V. The Heusler alloy may be, for example, $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$ or the like.

The thicknesses of the first ferromagnetic layer 1 and the second ferromagnetic layer 2 are, for example, 3 nm or less. If the first ferromagnetic layer 1 and the second ferromagnetic layer 2 have a thin thickness, interfacial magnetic anisotropy occurs at an interface between the first ferromagnetic layer 1, the second ferromagnetic layer 2 and the tunnel barrier layer 3, and the directions of magnetization of the first ferromagnetic layer 1 and the second ferromagnetic layer 2 are easily oriented in a direction perpendicular to a lamination plane.

An antiferromagnetic layer may be provided on a surface of the second ferromagnetic layer 2 on an opposite side to the tunnel barrier layer 3 via a spacer layer. The second ferromagnetic layer 2, the spacer layer, and the antiferromagnetic layer have a synthetic antiferromagnetic structure (an SAF structure). The synthetic antiferromagnetic structure is made up of two magnetic layers sandwiching a non-magnetic layer. Since the second ferromagnetic layer 2 and the antiferromagnetic layer are antiferromagnetically coupled, a coercive force of the second ferromagnetic layer 2 becomes greater than that in a case of not having an antiferromagnetic layer. The antiferromagnetic layer is, for example, IrMn, PtMn or the like. The spacer layer includes, for example, at least one selected from the group consisting of Ru, Ir, and Rh.

(Tunnel Barrier Layer)

The tunnel barrier layer 3 contains a non-magnetic oxide. The non-magnetic oxide is, for example, an oxide containing Mg and at least one of Al and Ga. The non-magnetic oxide is represented by, for example, Mg—(Al, Ga)—O. In the composition notation of the non-magnetic oxide, since a ratio between Mg and Al or Ga is not determined, the composition is often described as above without using a subscript.

The tunnel barrier layer 3 has an ordered spinel structure and a disordered spinel structure as a crystal structure. The composition of the oxide forming the ordered spinel structure and the composition of the oxide forming the disordered spinel structure may be the same or different. For example, the oxide forming the ordered spinel structure may be an oxide (Mg—Ga—O) containing Mg and Ga, and the oxide forming the disordered spinel structure may be an oxide (Mg—Al—O) containing Mg and Al.

Figure 2:
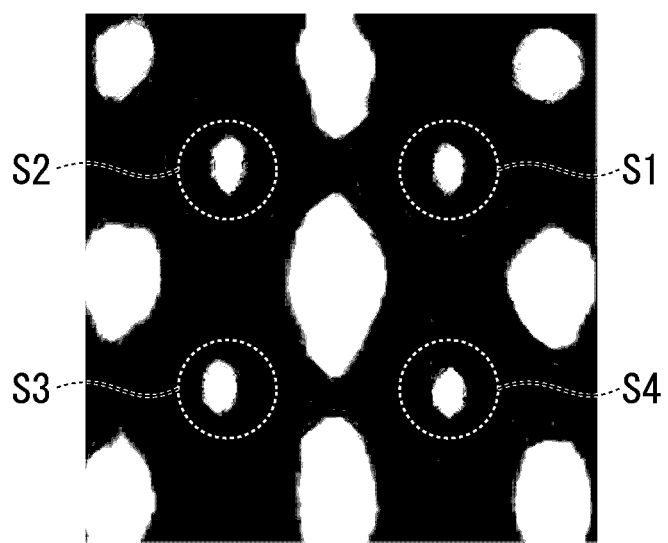
FIG. 2 shows a result obtained by performing nano-electron beam diffraction (NBD) on an ordered spinel structure using a transmission electron microscope (TEM).
Figure 3:
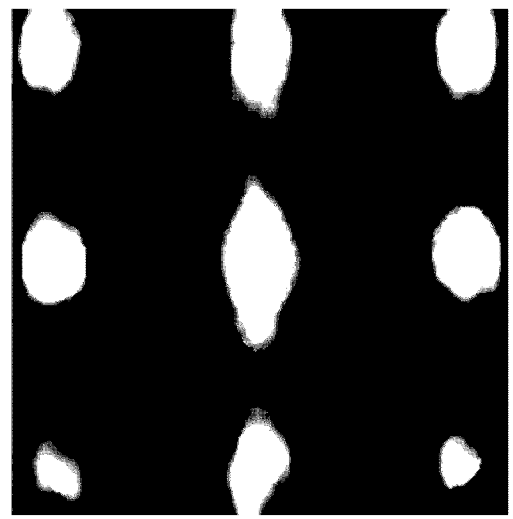
FIG. 3 shows a result obtained by performing nano-electron beam diffraction (NBD) on the disordered spinel structure, using a transmission electron microscope (TEM).

FIG. 2 shows the result of performing nano-electron beam diffraction (NBD) on a crystal having the ordered spinel structure, using a transmission electron microscope (TEM). Further, FIG. 3 shows the result of performing nano-electron beam diffraction (NBD) on a crystal having the disordered spinel structure, using s transmission electron microscope (TEM). The nano-electron beam diffraction measures the electron pattern. The electron beam pattern is an electron image obtained by irradiating a thin sample obtained by thinning the magnetoresistance effect element 10 with an electron beam narrowed to a diameter of about 1 nm, and transmitting and diffracting the electron beam. FIGS. 2 and 3 show the results obtained by making the electron beam incident on the [100] orientation of the thin sample. Hereinafter, the electron beam pattern shown in FIG. 2 is referred to as a first electron beam pattern, and the electron beam pattern shown in FIG. 3 is referred to as a second electron beam pattern.

White portions shown in FIGS. 2 and 3 are diffraction spots in which diffracted light is detected, and are regularly arranged. Difference in sizes of the diffraction spots are due to a distance from a central axis of the incident light, the diffraction easiness with respect to atoms as diffraction points, and the like. The first electron beam pattern (FIG. 2) is different from the second electron beam pattern (FIG. 3). When the first electron beam pattern (FIG. 2) is compared with the second electron beam pattern (FIG. 3), spots S1, S2, S3, and S4 (hereafter collectively referred to as "a first order spot") observed in a region surrounded by dotted line increase in the first electron beam pattern (FIG. 2). In the first electron beam pattern, a brightness is equal in the spots S1, S2, S3, and S4. Depending on the electron beam pattern, these is a case that the spots S1, S2, S3, and S4 have different brightness or a case that any of spots S1, S2, S3, and S4 are not observed. The electron beam pattern of which the spots S1, S2, S3, and S4 have different brightness or any of spots S1, S2, S3, and S4 are not observed means a first pseudo electron beam pattern.

The electron beam pattern can be regarded as a Fourier transform of the crystal lattice, and observes changes in effective lattice constant and crystal symmetry. A difference in the electron beam pattern between the ordered spinel structure and the disordered spinel structure is due to a difference in the crystal structure between the ordered spinel structure and the disordered spinel structure.

Figure 4:
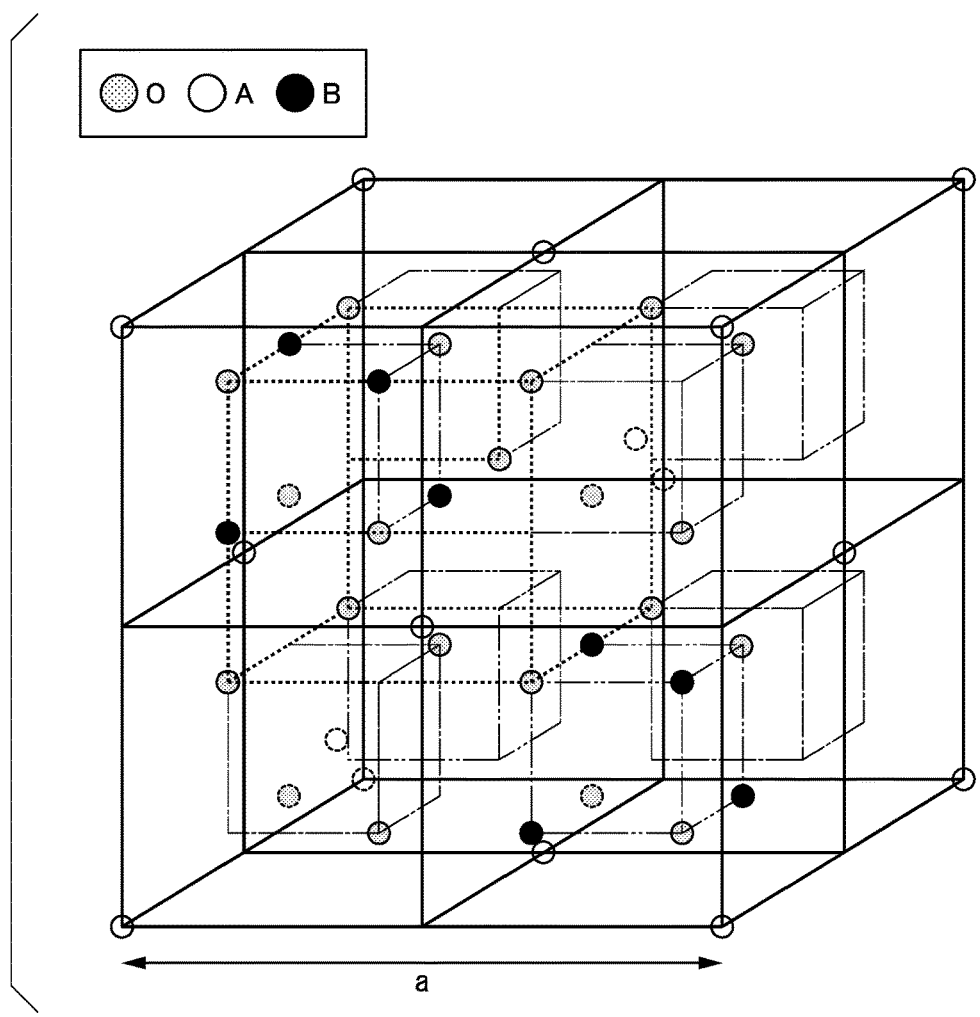
FIG. 4 is a diagram showing a crystal structure of an ordered spinel structure.

FIG. 4 is a diagram showing a crystal structure of an ordered spinel structure. In the ordered spinel structure, a site at which the element A is ionized, and a site at which the element B is ionized are fixed, and the arrangement of these elements is regular. The element A is, for example, one or more kinds of elements selected from the group consisting of Mg and Zn, and the element B is one or more kinds of elements selected from the group consisting of Al, In, and Ga. The element A is, for example, Mg, and the element B is, for example, Al or Ga. An oxide of Mg and Ga (Mg—Ga—O) is likely to have the ordered spinel structure.

Figure 5:
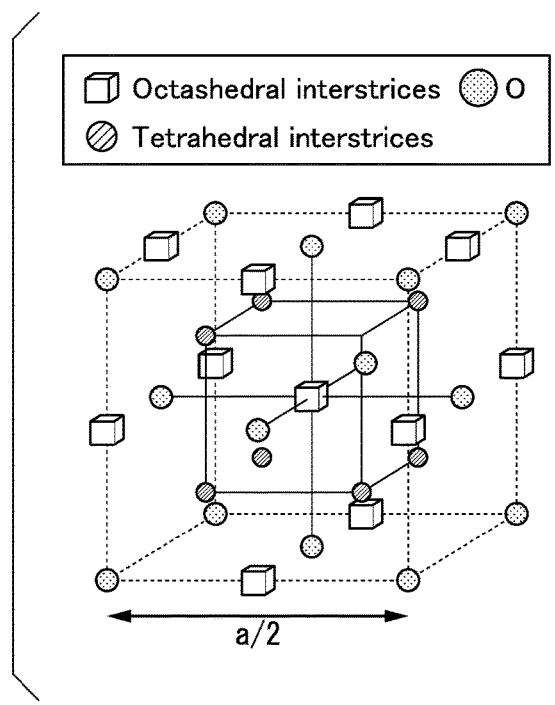
FIG. 5 is a diagram showing a crystal structure of a disordered spinel structure.

FIG. 5 is a diagram showing a crystal structure of a disordered spinel structure. In the case of the disordered spinel structure, the ionized element A or element B can exist at any of a tetrahedral coordination site and an octahedral coordination site with respect to oxygen. Which site the element A or the element B enters is random. When the elements A and B having different atomic radii randomly enter these sites, the crystal structure becomes irregular. The disordered spinel structure has, for example, the symmetry of a Fm-3m space group or the symmetry of a F-43m space group. An oxide of Mg and Al (Mg—Al—O) is likely to have a disordered spinel structure.

An effective lattice constant (a/2) of the disordered spinel structure is substantially half of an effective lattice constant (a) of the ordered spinel structure. For example, an actual lattice constant of the crystal having the ordered spinel structure may be 0.808 nm, and a substantial lattice constant of the crystal having the disordered spinel structure is 0.404 nm. Here, the term "substantial lattice constant" is a case in which the lattice constant slightly changes due to oxygen deficiency or the like and is a lattice constant allowed when crystallized as a spinel or a disordered spinel.

Here, the term "substantially" means an amount of lattice deviation that does not cause loss of crystallinity, and includes a deviation of about 3% on the basis of the value of the lattice constant. Further, the term "substantially half" includes a deviation of 4% around a half of the lattice constant (a) of the ordered spinel structure.

A difference in the effective lattice constant between the ordered spinel structure and the disordered spinel structure causes a difference in the electron beam pattern between the ordered spinel structure and the disordered spinel structure. The second electron beam pattern (FIG. 3) observes a basic reflection from a face-centered cubic (FCC) lattice. The first electron beam pattern (FIG. 2) observes reflection from a {220} plane, in addition to the basic reflection from the face-centered cubic (FCC) lattice. The reflection from the {220} plane corresponds to the first order spots. When the ordered spinel structure and the disordered spinel structure are mixed, the diffraction intensity of the electron beam becomes weak, thereby a brightness in the order spots decreases in a part of the order spots.

The thickness of the tunnel barrier layer 3 is, for example, 3 nm or less. When the thickness of the tunnel barrier layer 3 is 3 nm or less, the wave functions of the first ferromagnetic layer 1 and the second ferromagnetic layer 2 easily overlap each other beyond the tunnel barrier layer 3, and the tunnel effect of the wave function between the ferromagnetic layers and a coherent tunnel effect is easily obtained.

Figure 6:
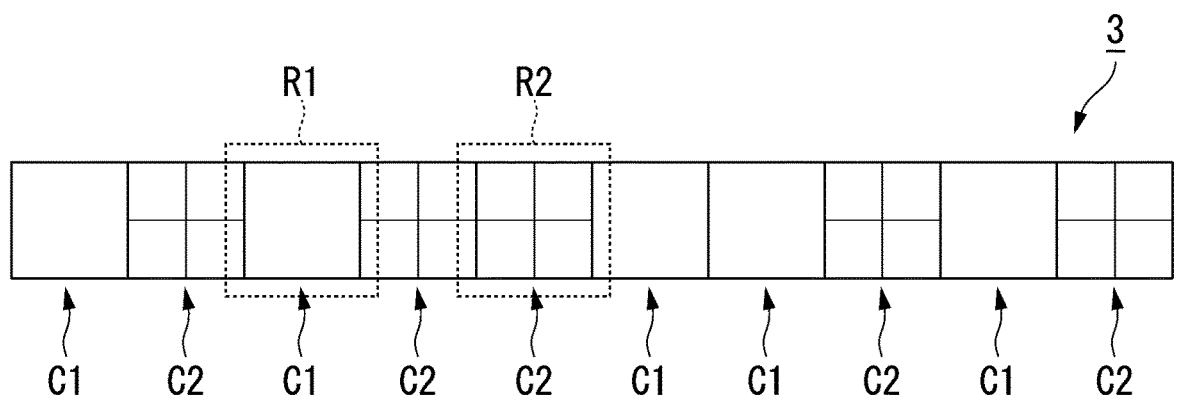
FIG. 6 is a diagram showing an example of a crystal structure of a tunnel barrier layer.
Figure 7:
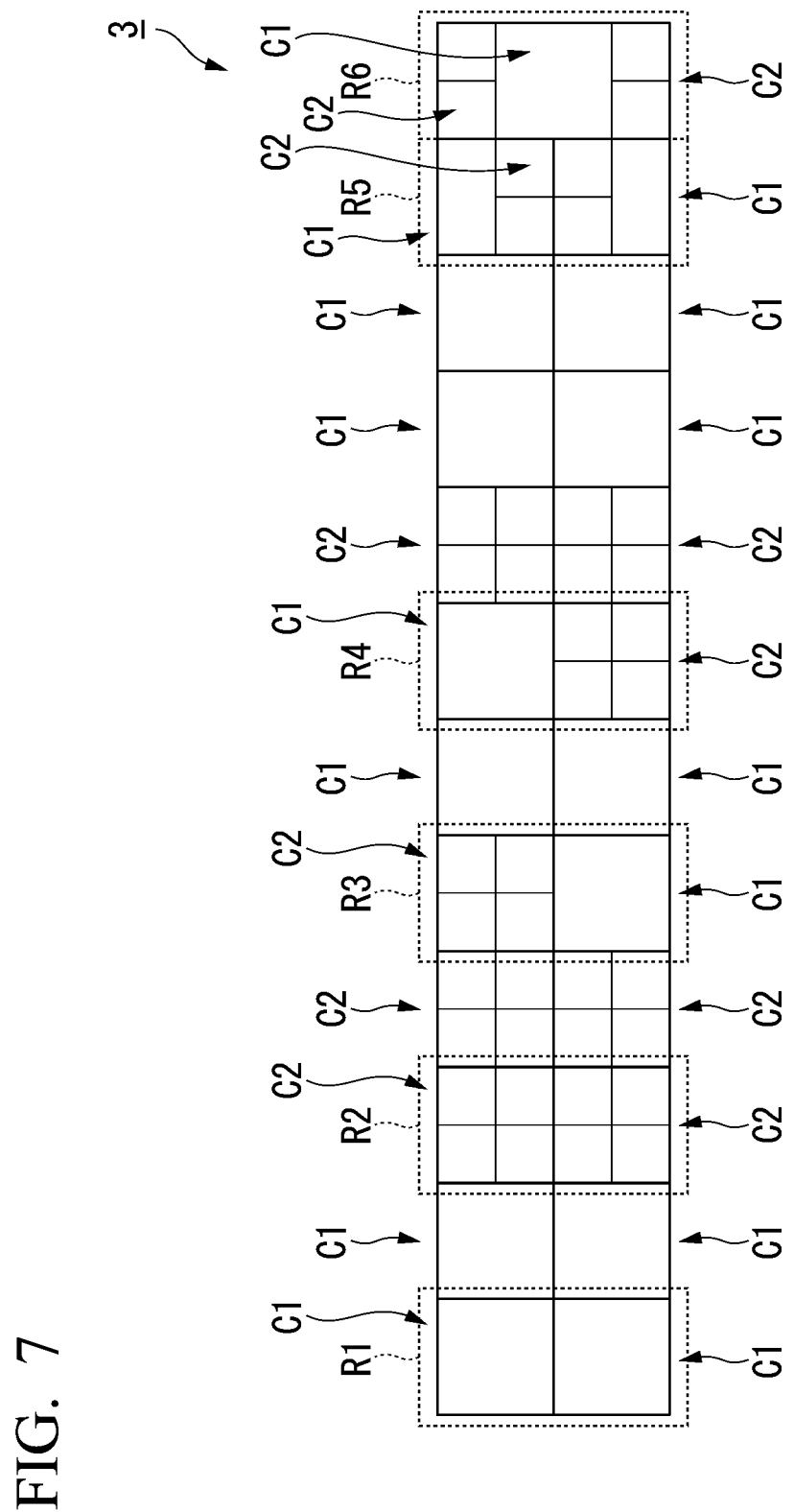
FIG. 7 is a diagram showing another example of the crystal structure of the tunnel barrier layer.

FIGS. 6 and 7 are diagrams showing an example of the crystal structure of the tunnel barrier layer 3. As described above, the tunnel barrier layer 3 is, for example, 3 nm or less, and for example, in the case of an ordered spinel structure having a lattice constant of 0.808 nm, the tunnel barrier layer 3 includes unit lattices of several layers. FIG. 6 shows a case in which the unit lattice forming the tunnel barrier layer 3 is one layer. FIG. 7 shows a case in which the unit lattice forming the tunnel barrier layer 3 has a plurality of layers.

The tunnel barrier layer 3 shown in FIG. 6 has an ordered spinel structure C1 and a disordered spinel structure C2. In the tunnel barrier layer 3 shown in FIG. 6, a region including only the ordered spinel structure C1 is referred to as a first region R1, and a region including only the disordered spinel structure C2 is referred to as a second region R2. The first region R1 is an example of a first portion, and the second region R2 is an example of a second portion.

The first region R1 shows a first electron beam pattern in the nano-electron beam diffraction (NBD) using a transmission electron microscope (TEM). The second region R2 shows a second electron beam pattern in the nano-electron beam diffraction (NBD) using the transmission electron microscope (TEM).

Figure 8:
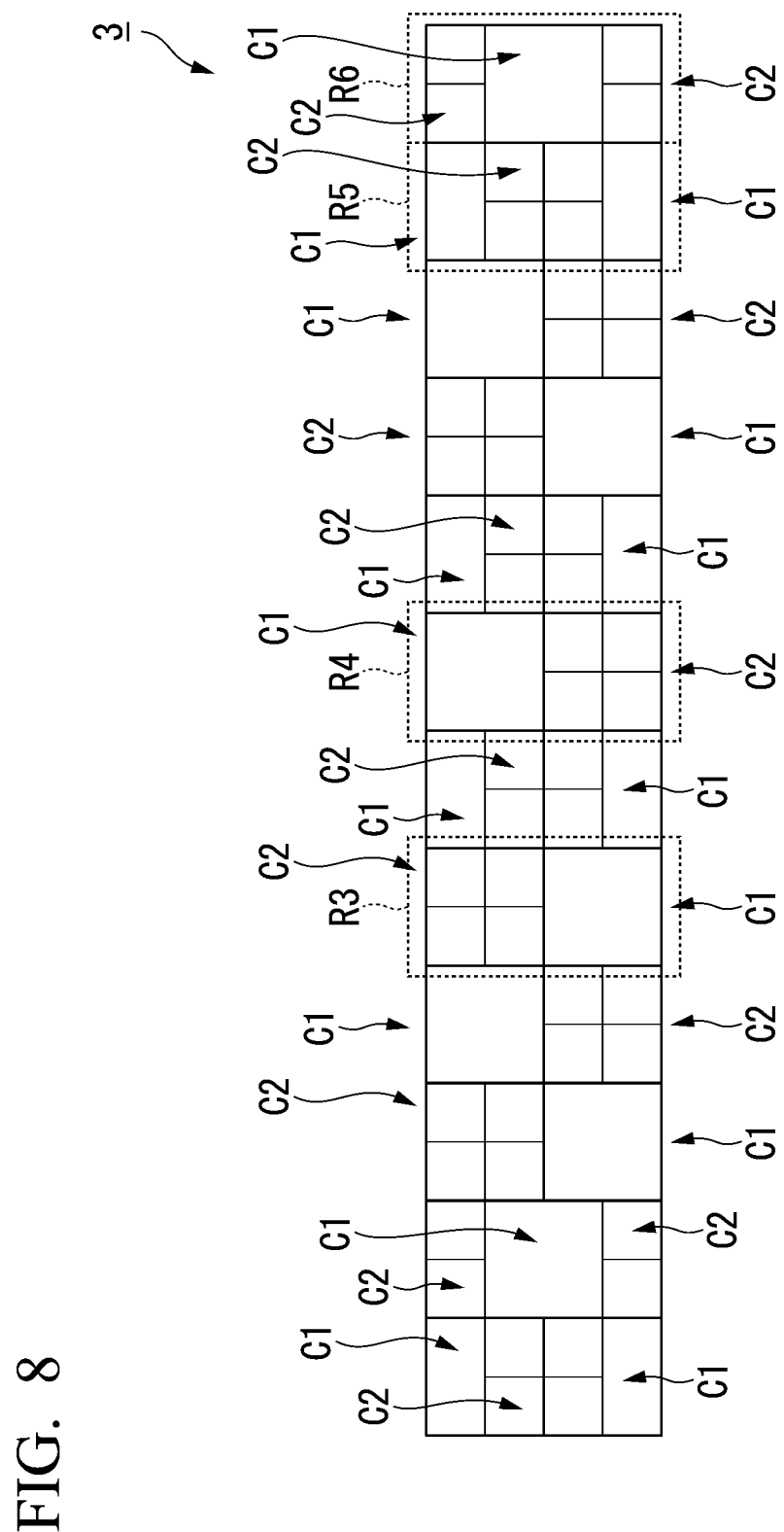
FIG. 8 is a diagram showing another example of the crystal structure of the tunnel barrier layer.

Further, the tunnel barrier layer 3 shown in FIG. 7 also has the ordered spinel structure C1 and the disordered spinel structure C2. In the tunnel barrier layer 3 shown in FIG. 7, a region including only the ordered spinel structure C1 in the laminating direction is referred to as a first region R1, a region including only the disordered spinel structure C2 in the laminating direction is referred to as a second region R2, a region laminated in the order of the ordered spinel structure C1 and the disordered spinel structure C2 is referred to as a third region R3, and a region laminated in the order of the disordered spinel structure C2 and the ordered spinel structure C1 is referred to as a fourth region R4. Further, a region laminated in the order of the ordered spinel structure C1, the disordered spinel structure C2, and the ordered spinel structure C1 is referred to as a fifth region R5, and a region laminated in the order of the disordered spinel structure C2, the ordered spinel structure C1, and the disordered spinel structure C2 is referred to as a sixth region R6. The third region R3, the fourth region R4, the fifth region R5, and the sixth region R6 are an example of a third portion. Since the crystal grows in the laminating direction, the probability of occurrence of the third region R3, the fourth region R4, the fifth region R5, and the sixth region R6, in which different crystal structures are laminated, is lower than the probability of occurrence of the first region R1 and the second region R2. The third region R3, the fourth region R4, the fifth region R5, and the sixth region R6 are a mixed crystal including the ordered spinel structure and the disordered spinel structure. The tunnel barrier layer 3 may consists of the first region R1 and one or more region selected from a group consisting of the third region R3, the fourth region R4, the fifth region R5, and the sixth region R6. The tunnel barrier layer 3 may consists of the second region R2 and one or more region selected from a group consisting of the third region R3, the fourth region R4, the fifth region R5, and the sixth region R6. Furthermore, as shown in FIG. 8, the tunnel barrier layer 3 may consists of one or more region selected from a group consisting of the third region R3, the fourth region R4, the fifth region R5, and the sixth region R6.

The first region R1 shows a first electron beam pattern in the nano-electron beam diffraction (NBD), using the transmission electron microscope (TEM). The second region R2 shows a second electron beam pattern in the nano-electron beam diffraction (NBD), using the transmission electron microscope (TEM). The third region R3, the fourth region R4, the fifth region R5, and the sixth region R6 show a first pseudo electron beam pattern in the nano-electron beam diffraction (NBD), using the transmission electron microscope (TEM). The first region R1 is an example of the first portion. The second region R2 is an example of the second portion. The third region R3, the fourth region R4, the fifth region R5, and the sixth region R6 are an example of the third portion.

The first order spots (the spots surrounded by the dotted line in FIG. 2) in the first electron beam pattern are caused by an ordered spinel structure in which an effective lattice constant is approximately twice that of the disordered spinel structure. In the first portion, the first order spot occurs in the electron beam pattern to form a first electron beam pattern. Since the third region R3, the fourth region R4, the fifth region R5, and the sixth region R6 include the ordered spinel structure C1, they show the order spot. However, the third region R3, the fourth region R4, the fifth region R5, and the sixth region R6 form the first pseudo electron beam pattern, since a peak intensity is changed in a position thereof.

The first region R1 including only the ordered spinel structure shows a first order spot having high brightness while being uniform, as compared with the third region R3 and the fourth region R4 partially having the ordered spinel structure. As explained above, a spot obtained by irradiating the third region R3, the fourth region R4, the fifth region R5, and the sixth region R6 with an electron beam may be thinner than the first order spot obtained by irradiating the first region R1 with an electron beam (the diffraction intensity of the electron beam is weak), and a part of the first order spot may not be seen.

A ratio of the ordered spinel structure in the tunnel barrier layer 3 is preferably equal to or greater than 10% and equal to or less than 90%, and more preferably, equal to or greater than 20% and equal to or less than 80%. A ratio occupied by the disordered spinel structure in which the second electron beam pattern is obtained in the tunnel barrier layer 3 is preferably greater than 0% and equal to or less than 10% or equal to or greater than 90% and less than 100%, and more preferably, equal to or greater than 0% and equal to or less than 20% or equal to or greater than 80% and less than 100%.

A ratio of the ordered spinel structure in the tunnel barrier layer 3 is obtained as follows.

First, the magnetoresistance effect element 10 is cut along a plane along the laminating direction using a focused ion beam to produce a thin sample of the magnetoresistance effect element 10. Next, ten different locations on the tunnel barrier layer 3 of the thin sample are irradiated with the electron beam of the transmission electron microscope (TEM), and nano-electron beam diffraction (NBD) is performed at each location. The ten locations irradiated with the electron beam divide, for example, the tunnel barrier layer 3 into eleven sections at equal intervals in one direction in the plane, and set them to each of positions between adjacent sections.

Further, the electron beam patterns obtained from each of the ten locations are separated into the first electron beam pattern and the first pseudo electron beam pattern, and the second electron beam pattern by a presence or absence of spots. For each electron beam patterns obtained from the ten locations, a brightness is measured in spots S1 to S4. For each ten locations, an average of the brightness of the spots S1 to S4 (the brightness average) is measured, when a brightness of one spot having a highest brightness in the spots S1 to S4 is determined 100. In each ten locations, the average of the brightness of the spots S1 to S4 shows a ratio of the ordered spinel structure. Accordingly, an average calculated from the ratios of the ordered spinel structure in the electron beam patterns of the ten locations is a ratio of the ordered spinel structure in the tunnel barrier layer 3.

Further, the tunnel barrier layer 3 is preferably (001) oriented. The tunnel barrier layer 3 may be a (001) oriented single crystal or may be a polycrystal mainly containing a (001) oriented crystal. When the tunnel barrier layer 3 is (001) oriented, the lattice matching with the first ferromagnetic layer 1 and the second ferromagnetic layer 2 is enhanced, and the coherent tunnel effect is easily obtained. In particular, when the first ferromagnetic layer 1 or the second ferromagnetic layer 2 is Fe, Co—Fe, a Co-based Heusler alloy or the like containing an Fe element, the lattice matching is enhanced.

The magnetoresistance effect element 10 has, for example, a columnar shape. The magnetoresistance effect element 10 has, for example, a circular shape, an elliptical shape, a square shape, a triangular shape, and a polygonal shape in a plan view from the laminating direction. It is preferable that the shape of the magnetoresistance effect element 10 in a plan view from the laminated direction be circular or elliptical from the viewpoint of symmetry.

A length of a long side of the magnetoresistance effect element 10 in a plan view from the laminating direction is preferably equal to or less than 80 nm, more preferably equal to or less than 60 nm, and even more preferably equal to or less than 30 nm. If the length of the long side is equal to or less than 80 nm, it is difficult to form a domain structure in the ferromagnetic material, and it is not necessary to consider a component different from the spin polarization in the ferromagnetic metal layer.

Further, if the length of the long side is equal to or less than 30 nm, a single domain structure is formed in the ferromagnetic layer, and the magnetization reversal speed and the probability are improved. In addition, there is a strong demand for a low resistance especially in miniaturized magnetoresistance effect elements.

Next, a method for manufacturing the magnetoresistance effect element 10 according to the present embodiment will be described. The magnetoresistance effect element 10 is obtained by sequentially laminating the first ferromagnetic layer 1, the tunnel barrier layer 3, and the second ferromagnetic layer 2. The method for forming each layer includes, for example, a sputtering method, an evaporation method, a laser ablation method and a molecular beam epitaxy (MBE) method.

The tunnel barrier layer 3 has film formation conditions of first conditions and second conditions. The tunnel barrier layer 3 is, for example, formed under the first condition and then formed under the second condition. Further, the tunnel barrier layer 3 may be formed, for example, under the second condition and then formed under the first condition.

The first condition is a film formation condition in which oxygen sufficient to form the ordered spinel structure is supplied to a layer serving as the tunnel barrier layer 3. For example, when an alloy is laminated and the alloy is sufficiently oxidized, the tunnel barrier layer 3 is obtained. The oxidation is, for example, a plasma oxidation or an oxidation performed by oxygen introduction. The tunnel barrier layer 3 has an ordered spinel structure when sufficient oxygen is supplied.

Whether the ionized element A and the element B enter a tetrahedral coordination site or an octahedral coordination site with respect to oxygen is greatly affected by the energy potential. When sufficient oxygen is supplied to the tunnel barrier layer 3, from the viewpoint of energy potential, the sites in which each of the ionized elements A and B are stabilized are fixed, and the ordered spinel structure is stabilized.

The amount of oxygen sufficient to form the ordered spinel structure can be obtained from the amount of oxygen theoretically taken in from the composition formula. For example, when oxygen in excess of the amount of oxygen theoretically taken in from the composition formula is supplied into the oxidation treatment chamber, oxygen sufficient to form an ordered spinel structure is taken into the layer serving as the tunnel barrier layer 3. The amount of oxygen taken into the layer serving as the tunnel barrier layer 3 can be freely controlled by adjusting, for example, the flow rate of oxygen introduced into the oxidation treatment chamber, the pressure of the oxidation treatment chamber, the oxidation time, and the amount of oxygen with respect to the composition of the target alloy. For example, under the first condition, the pressure in the oxidation treatment chamber is set to 100 Pa.

The second condition is a condition in which the amount of oxygen supplied to the layer serving as the tunnel barrier layer 3 is smaller than in the first condition. If the amount of supply of oxygen is insufficient, the tunnel barrier layer 3 has a disordered spinel structure.

When oxygen is deficient in the tunnel barrier layer 3, oxygen is one of the elements that contribute to the crystal lattice, and the crystal structure is disturbed. When the crystal structure is disturbed, the energy states at the sites in which the tetrahedral coordination or the octahedral coordination with respect to oxygen is performed are also disturbed. When the energy state is disturbed, the element A supposed to be stabilized at the site in which the tetrahedral coordination is performed with respect to oxygen is stabilized at the site in which the octahedral coordination is performed with respect to oxygen, or vice versa. Therefore, which site the element A and the element B enter is entirely random, and as a result, it is easy to stabilize with a more disordered spinel structure.

The second condition, for example, reduces the flow rate of oxygen to be introduced into the oxidation treatment chamber from the first condition.

As another example, the second condition sets the pressure of the oxidation treatment chamber to be lower than the first condition. As another example, the second condition sets the oxidation time to be shorter than in the first condition. As another example, the second condition reduces the amount of oxygen with respect to the composition of the target alloy. For example, under the second condition, the pressure in the oxidation treatment chamber is set to 1 Pa.

Since the tunnel barrier layer 3 is thin, even if the first condition and the second condition are sequentially performed, the ordered spinel structure and the disordered spinel structure are mixed in the tunnel barrier layer 3. The tunnel barrier layer 3 may be heated after the film formation.

Next, an application example of the magnetoresistance effect element 10 according to the embodiment will be described. The magnetoresistance effect element 10 can be used for, for example, a magnetic sensor, a memory such as an MRAM, or the like.

Figure 9:
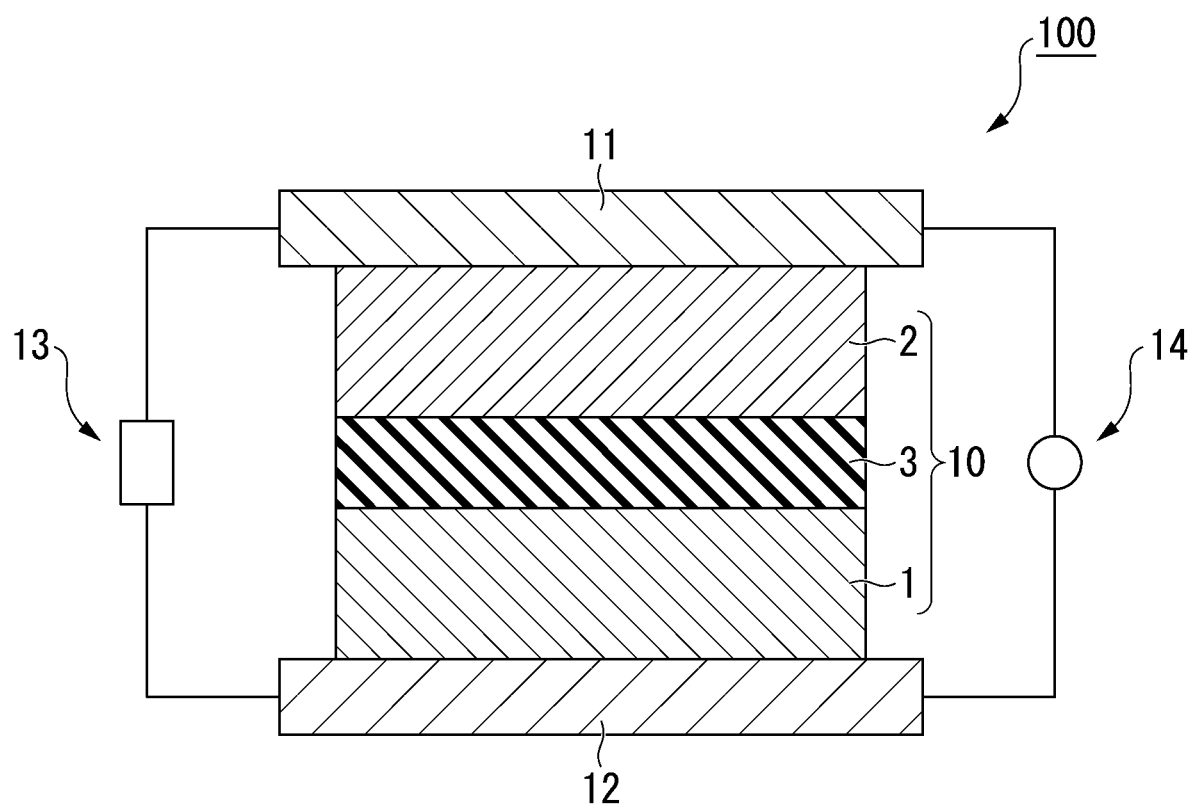
FIG. 9 is a cross-sectional view of a magnetic recording element according to a first application example of the magnetoresistance effect element.

FIG. 9 is a cross-sectional view of a magnetic recording element 100 according to a first application example. FIG. 9 is a cross-sectional view of the magnetoresistance effect element 10 taken along the laminating direction of each layer of the magnetoresistance effect element. The magnetic recording element 100 shown in FIG. 9 is an example of an application example of the magnetoresistance effect element 10.

The magnetic recording element 100 has the magnetoresistance effect element 10, a first electrode 11, a second electrode 12, a power supply 13, and a measuring unit 14. The first electrode 11 is connected to a first surface of the magnetoresistance effect element 10 in the laminating direction. The second electrode 12 is connected to a second surface of the magnetoresistance effect element 10 in the laminating direction. The first electrode 11 and the second electrode 12 are conductors, for example, made of Cu. The power supply 13 and the measuring unit 14 are connected to the first electrode 11 and the second electrode 12, respectively. The power supply 13 gives a potential difference in the laminating direction of the magnetoresistance effect element 10. The measuring unit 14 measures a resistance value of the magnetoresistance effect element 10 in the laminating direction.

When a potential difference is generated between the first electrode 11 and the second electrode 12 by the power supply 13, a current flows in the laminating direction of the magnetoresistance effect element 10. The current is spin-polarized when passing through the second ferromagnetic layer 2, and turns to a spin polarization current. The spin polarization current reaches the first ferromagnetic layer 1 via the tunnel barrier layer 3. The magnetization of the first ferromagnetic layer 1 undergoes a magnetization reversal by receiving a spin transfer torque (STT) due to the spin polarization current. When a direction of magnetization of the first ferromagnetic layer 1 and a direction of magnetization of the second ferromagnetic layer 2 change, the resistance of the magnetoresistance effect element 10 in the laminating direction changes. A resistance value of the magnetoresistance effect element 10 in the laminating direction is read by the measuring unit 14. That is, the magnetic recording element 100 shown in FIG. 9 is a spin transfer torque (STT) type magnetic recording element.

Figure 10:
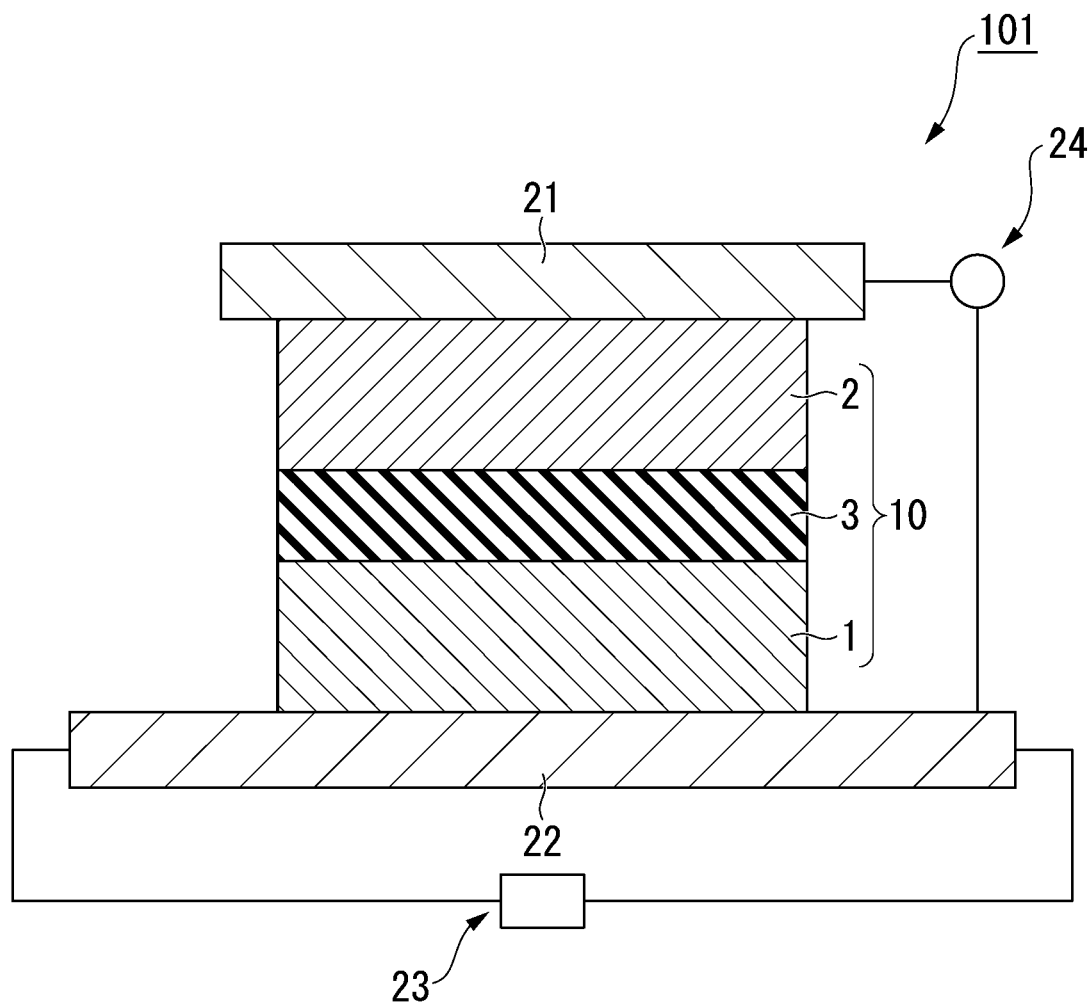
FIG. 10 is a cross-sectional view of a magnetic recording element according to a second application example of the magnetoresistance effect element.

FIG. 10 is a cross-sectional view of a magnetic recording element 101 according to a second application example. FIG. 10 is a cross-sectional view of the magnetoresistance effect element 10 taken along the laminating direction of each layer of the magnetoresistance effect element. The magnetic recording element 101 shown in FIG. 10 is an example of an application example of the magnetoresistance effect element 10.

The magnetic recording element 101 has a magnetoresistance effect element 10, a first electrode 21, a first wiring 22, a power supply 23, and a measuring unit 24. The first electrode 21 is connected to a first surface of the magnetoresistance effect element 10 in the laminating direction. The first wiring 22 is connected to a second surface of the magnetoresistance effect element 10 in the laminating direction. The first electrode 21 is a conductor, for example, made of Cu. The first wiring 22 includes one of a metal, an alloy, an intermetallic compound, a metal boride, a metal carbide, a metal silicide, and a metal phosphide having a function of generating a spin current by a spin Hall effect when the current flows. The first wiring 22 is, for example, a non-magnetic metal of an atomic number 39 or more having d electrons or f electrons on an outermost shell. The power supply 23 is connected to the first end and the second end of the first wiring 22.

The measuring unit 24 is connected to the first electrode 21 and the first wiring 22 to measure a resistance value of the magnetoresistance effect element 10 in the laminating direction.

When a potential difference occurs between the first end and the second end of the first wiring 22 by the power supply 23, the current flows along the first wiring 22. When the current flows along the first wiring 22, a spin Hall effect occurs due to spin orbit interaction. The spin Hall effect is a phenomenon in which a moving spin is bent in a direction orthogonal to a flow direction of the current. The spin Hall effect causes uneven distribution of spins in the first wiring 22 and induces a spin current in the thickness direction of the first wiring 22. The spin is injected from the first wiring 22 into the first ferromagnetic layer 1 by the spin current.

The spin injected into the first ferromagnetic layer 1 gives a spin orbit torque (SOT) to the magnetization of the first ferromagnetic layer 1. The first ferromagnetic layer 1 receives the spin orbit torque (SOT) and reverses the magnetization. When the direction of magnetization of the first ferromagnetic layer 1 and the direction of magnetization of the second ferromagnetic layer 2 change, the resistance value of the magnetoresistance effect element 10 in the laminating direction changes. The resistance value of the magnetoresistance effect element 10 in the laminating direction is read by the measuring unit 14. That is, the magnetic recording element 101 shown in FIG. 10 is a spin-orbit torque (SOT) type magnetic recording element.

The magnetoresistance effect element 10 according to the present embodiment can output a larger output voltage, for example, than a case in which the tunnel barrier layer 3 has only the ordered spinel structure. A large MR ratio and a high voltage resistance are required to improve the output voltage of the magnetoresistance effect element. Since the crystal structure of the ordered spinel structure is more stable than that of the disordered spinel structure, the MR ratio is hard to decrease even when a large voltage is applied. On the other hand, the disordered spinel structure can increase the MR ratio as compared with the ordered spinel structure. This is because the effective lattice constant of the disordered spinel structure is reduced by half as compared with the ordered spinel structure, and the lattice matching with the first ferromagnetic layer 1 and the second ferromagnetic layer 2 is easily increased. Since the ordered spinel structure and the disordered spinel structure are mixed in the magnetoresistance effect element 10 according to the present embodiment, the characteristics of each structure can be compatible. Accordingly, the magnetoresistance effect element 10 according to the present embodiment has a large MR ratio and a high voltage resistance, and the output voltage thereof is improved.

EXAMPLE

Example 1

The magnetoresistance effect element 10 shown in FIG. 1 was manufactured on an MgO (001) single crystal substrate. First, 40 nm of Cr was laminated as a base layer on the substrate, and a heat treatment was performed at 800° C. for an hour. 30 nm of Fe was laminated as the first ferromagnetic layer 1 and the heat treatment was performed at 300° C. for 15 minutes.

Next, a 0.5 nm film of an alloy represented by $Mg_{0.33}Al_{0.67}$ was formed on the first ferromagnetic layer 1 and subjected to a natural oxidation. The natural oxidation was performed by exposing the alloy to air of a pressure of 100 Pa for 600 seconds (the first condition). Thereafter, a 0.5 nm film of an alloy represented by $Mg_{0.33}Al_{0.67}$ was formed, and the natural oxidation was performed by exposing the alloy to air of a pressure of 1 Pa for 600 seconds (the second condition). Thereafter, the laminated film was subjected to the heat treatment in a vacuum at 400° C. for 15 minutes to obtain a tunnel barrier layer 3 (Mg—Al—O layer).

Next, 6 nm of Fe was laminated as the second ferromagnetic layer 2 on the tunnel barrier layer 3 and the heat treatment was performed at 350° C. for 15 minutes to obtain a magnetic tunnel junction. Next, a 12 nm film of IrMn was formed as an antiferromagnetic layer, and a 20 nm film of Ru was formed as a cap layer to obtain a magnetoresistance effect element 10. Finally, a heat treatment was performed at a temperature of 175° C. for 30 minutes while applying a magnetic field of 5 kOe to impart uniaxial magnetic anisotropy to the second ferromagnetic layer 2. The magnetoresistance effect element 10 was formed in a columnar shape of a diameter of 80 nm.

The magnetoresistance effect element 10 manufactured using the focused ion beam was cut on a surface along the laminating direction, and a thin sample of the tunnel barrier layer 3 was manufactured. Further, a thin sample was subjected to nano-electron beam diffraction (NBD), using the transmission electron microscope (TEM). Specifically, the thin sample was irradiated with an electron beam narrowed to a diameter of about 1 nm, and an electron beam pattern obtained by transmission diffraction was measured. Further, in the electron beam pattern observing the spot, the brightness of the spot was measured by using an image analysis software. The electron beam was applied to ten locations of the tunnel barrier layer 3. The ten locations irradiated with the electron beam divide the tunnel barrier layer 3 into eleven sections at equal intervals in one direction in the plane, and correspond to respective positions between the adjacent sections. The electron beam was incident in the direction of Mg—Al—O [100].

Five among the electron beam patterns measured at each of the ten locations were the first electron beam patterns, and the remaining five were the second electron beam patterns. The ratio occupied by the ordered spinel structure and the disordered spinel structure in the tunnel barrier layer 3 was 50%, respectively.

Examples 2 to 5

Examples 2 to 5 are different from Example 1 in that the manufacturing conditions of the tunnel barrier layer 3 are changed from Example 1. Other conditions were the same, and the electron beam pattern was measured at ten locations.

Example 2 is different from Example 1 in that the thickness of the alloy represented by $Mg_{0.33}Al_{0.67}$ naturally oxidized under the first condition was 0.1 nm, and the thickness of the alloy represented by $Mg_{0.33}Al_{0.67}$ naturally oxidized under the second condition was 0.9 nm. One of the electron beam patterns measured at each of the ten locations was the first electron beam pattern, and the remaining nine were the second electron beam patterns. The ratio occupied by the ordered spinel structure in the tunnel barrier layer 3 was 10%, and the ratio occupied by the disordered spinel structure was 90%.

Example 3 is different from Example 1 in that the thickness of the alloy represented by $Mg_{0.33}Al_{0.67}$ naturally oxidized under the first condition was 0.2 nm, and the thickness of the alloy represented by $Mg_{0.33}Al_{0.67}$ naturally oxidized under the second condition was 0.8 nm. Two of the electron beam patterns measured at each of the ten locations were the first electron beam patterns, and the remaining eight were the second electron beam patterns. The ratio occupied by the ordered spinel structure in the tunnel barrier layer 3 was 20%, and the ratio occupied by the disordered spinel structure was 80%.

Example 4 is different from Example 1 in that the thickness of the alloy represented by $Mg_{0.33}Al_{0.67}$ naturally oxidized under the first condition was 0.8 nm, and the thickness of the alloy represented by $Mg_{0.33}Al_{0.67}$ naturally oxidized under the second condition was 0.2 nm. Eight of the electron beam patterns measured at each of the ten locations were the first electron beam patterns, and the remaining two were the second electron beam patterns. The ratio occupied by the ordered spinel structure in the tunnel barrier layer 3 was 80%, and the ratio occupied by the disordered spinel structure was 20%.

Example 5 is different from Example 1 in that the thickness of the alloy represented by $Mg_{0.33}Al_{0.67}$ naturally oxidized under the first condition was 0.9 nm, and the thickness of the alloy represented by $Mg_{0.33}Al_{0.6}7$ naturally oxidized under the second condition was 0.1 nm. Nine of the electron beam patterns measured at each of the ten locations were the first electron beam patterns, and the remaining one was the second electron beam pattern. The ratio occupied by the ordered spinel structure in the tunnel barrier layer 3 was 90%, and the ratio occupied by the disordered spinel structure was 10%.

Comparative Example 1

In Comparative Example 1, when laminating the tunnel barrier layer 3, a film 1.0 nm of an alloy represented by $Mg_{0.33}Al_{0.6}7$ was formed and subjected to natural oxidation. The natural oxidation was performed by exposure to air at a pressure of 1 Pa for 600 seconds. Comparative Example 1 differs from Example 1 in that the film formation and the natural oxidation of the alloy were performed at a time. All the electron beam patterns measured at each of the ten locations were the second electron beam patterns. The ratio occupied by the ordered spinel structure in the tunnel barrier layer 3 was 0%, and the ratio occupied by the disordered spinel structure was 100%.

Comparative Example 2

In Comparative Example 2, when laminating the tunnel barrier layer 3, a film 1.0 nm of an alloy represented by $Mg_{0.33}Al_{0.67}$ was formed and subjected to natural oxidation. The natural oxidation was performed by exposure to air at a pressure of 100 Pa for 600 seconds. Comparative Example 1 differs from Example 1 in that the film formation and the natural oxidation of the alloy were performed at a time. All the electron beam patterns measured at each of the ten locations were the first electron beam patterns. The ratio occupied by the ordered spinel structure in the tunnel barrier layer 3 was 100%, and the ratio occupied by the disordered spinel structure was 0%.

The MR ratios of the magnetoresistance effect elements of Examples 1 to 5 and Comparative Examples 1 and 2 were measured, respectively. The measurement was performed at 300 K (room temperature). The output voltages of the magnetoresistance effect elements of Examples 1 to 5 and Comparative Examples 1 and 2 were also determined. The MR ratio and the output voltage were determined on the basis of the following formula. The output voltage was determined from the MR ratio and the applied voltage when applying a voltage ($V_{half}$) at which the MR ratio was reduced by half.

"MR ratio (%)"=$(R_{AP}-R_P)/R_P \times 100$

"Output voltage"=$\frac{1}{2}V_{bias}(TMR(V)/1+TMR(V))$ $R_P$ is a resistance when the magnetization directions of the first ferromagnetic layer 1 and the second ferromagnetic layer 2 are parallel, and $R_{AP}$ is a resistance when the magnetization directions of the first ferromagnetic layer 1 and the second ferromagnetic layer 2 are antiparallel. TMR is $(R_{AP}-R_P)/RP$.

$V_{bias}$ is an applied voltage, which is a voltage ($V_{half}$) at which the MR ratio is reduced by half. TMR (V) is an MR ratio when a voltage is applied. The voltage characteristics were determined by first measuring the MR ratio when applying a low voltage of 1 mV and by increasing the applied voltage. The results thereof are summarized in Table 1 below.

TABLE 1

| | First portion ratio (%) | MR (%) | Vhalf (V) | TMR (V) (%) | Output voltage (V) |
|---|---|---|---|---|---|
| Comparative example 1 | 0 | 183 | 1 | 92 | 0.24 |
| Example 2 | 10 | 179 | 1.3 | 107 | 0.31 |
| Example 3 | 20 | 181 | 1.47 | 123 | 0.35 |
| Example 1 | 50 | 175 | 1.46 | 123 | 0.34 |
| Example 4 | 80 | 179 | 1.46 | 122 | 0.34 |
| Example 5 | 90 | 159 | 1.4 | 107 | 0.31 |
| Comparative example 2 | 100 | 136 | 1.38 | 88 | 0.28 |

As can be seen from Table 1, the magnetoresistance effect elements shown in Examples 1 to 5 were superior in output voltage to the magnetoresistance effect elements shown in Comparative Examples 1 and 2.

EXPLANATION OF REFERENCES

1 First ferromagnetic layer
2 Second ferromagnetic layer
3 Tunnel barrier layer
10 Magnetoresistance effect element
11, 21 First electrode
12 Second electrode
22 First wiring
13, 23 Power supply
14, 24 Measuring unit

What is claimed is:

1. A tunnel barrier layer comprising:
   a non-magnetic oxide,
   wherein a crystal structure of the tunnel barrier layer includes both an ordered spinel structure and a disordered spinel structure, and
   the ordered spinel structure shows a reflection from a body-centered cubic (FCC) lattice and a reflection from a {220} plane in a nano-electron beam diffraction using a transmission electron microscope.

2. The tunnel barrier layer according to claim 1, wherein a lattice constant of the disordered spinel structure is substantially half of a lattice constant of the ordered spinel structure.

3. The tunnel barrier layer according to claim 1, further comprising:
   two or more of a first portion indicating a first electron beam pattern, a second portion indicating a second electron beam pattern, and a third portion indicating a first pseudo electron beam pattern, in nano-electron beam diffraction using a transmission electron microscope.

4. The tunnel barrier layer according to claim 1, consisting of a third portion indicating the first pseudo electron beam pattern in nano-electron beam diffraction using a transmission electron microscope.

5. The tunnel barrier layer according to claim 1, wherein a ratio of the ordered spinel structure is 10% or more and 90% or less.

6. The tunnel barrier layer according to claim 1, wherein a ratio of the ordered spinel structure is 20% or more and 80% or less.

7. The tunnel barrier layer according to claim 1, wherein the non-magnetic oxide includes Mg and at least one of Al and Ga.

8. The tunnel barrier layer according to claim 1, further comprising:
   an oxide containing Mg and Ga, and an oxide containing Mg and Al, wherein the oxide containing Mg and Ga has the ordered spinel structure, and the oxide containing Mg and Al has the disordered spinel structure.

9. The tunnel barrier layer according to claim 1, wherein an orientation direction of the crystal is a (001) orientation.

10. A magnetoresistance effect element comprising:
    the tunnel barrier layer according to claim 1; and
    a first ferromagnetic layer and a second ferromagnetic layer sandwiching the tunnel barrier layer in a thickness direction.

11. The magnetoresistance effect element according to claim 10, wherein at least one of the first ferromagnetic layer and the second ferromagnetic layer contains an Fe element.

12. A method for manufacturing a tunnel barrier layer according to claim 1, comprising:
    a first condition in which oxygen sufficient to form an ordered spinel structure is supplied; and a second condition in which an amount of oxygen supply is smaller than in the first condition.

* * * * *